US004001719B2

United States Statutory Invention Registration [19]

[11] Reg. Number: H1719

[45] Published: Apr. 7, 1998

Noakes et al.

[54] LOOSE END DETECTOR FOR TOBACCO ARTICLES

[75] Inventors: Derek P. Noakes, Pleasant Garden; David R. Smart, Greensboro, both of N.C.

[73] Assignee: Lorillard Tobacco Company, New York, N.Y.

[21] Appl. No.: 827,166

[22] Filed: Jan. 28, 1992

[51] Int. Cl.[6] ..... G01R 27/26

[52] U.S. Cl. ..... 324/687; 324/686

[58] Field of Search ..... 324/687, 690; 156/60, 272.2, 275.5, 275.7; 427/516

[56] References Cited

U.S. PATENT DOCUMENTS

| | | | |
|---|---|---|---|
| 3,515,987 | 6/1970 | Zurbrick et al. | 324/687 |
| 3,993,194 | 11/1976 | Reuland | 324/684 |
| 4,021,897 | 5/1977 | Fisli | 156/275.7 |
| 4,418,284 | 11/1983 | Ogawa et al. | 156/275.7 |
| 4,560,923 | 12/1985 | Hanson | 324/687 |
| 4,877,475 | 10/1989 | Uchida et al. | 156/275.7 |
| 5,034,083 | 7/1991 | Campanelli et al. | 156/275.7 |
| 5,121,068 | 6/1992 | Baker | 324/690 |
| 5,137,770 | 8/1992 | Rothe et al. | 156/60 |

*Primary Examiner*—Bernarr E. Gregory
*Attorney, Agent, or Firm*—White & Case

[57] ABSTRACT

A device for detecting loose ends in tobacco articles such as cigarettes comprises a stationary cam for positioning the articles prior to reaching a flat sensor surface. A pair of concentric electrodes are arranged on the sensor surface for generating an electric field. Cigarettes are moved through the field so as to create a field disturbance. Deviations from a predetermined field disturbance indicate that a cigarette is defective. A piece of thin glass, of about 5.5 mils, covers the sensor surface and is adhered thereto to protect against wear. Compared to surface protecting members previously used, the glass member significantly extends the wear life of the sensor, improves the sensitivity of the device, improves detection accuracy, and eliminates the need for daily readjustment of the field.

9 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

LOOSE END DETECTOR FOR TOBACCO ARTICLES

BACKGROUND OF THE INVENTION

This invention relates generally to sensors that can determine by capacitive means the density of tobacco in articles such as cigarettes, cigars, and the like, and in particular devices for detecting loose ends in cigarettes.

Cigarettes are manufactured using high speed machinery, which performs various steps in forming and cutting tobacco rods, and attaching a filter plug to one end of the tobacco cylinder using a tipping paper. At one or more stages of the process, it is important to confirm that the tobacco end of the cigarette is packed properly with tobacco, and to remove cigarettes where the tobacco is loose.

U.S. Pat. No. 3,993,194 discloses a device for detecting loose ends in tobacco articles which utilizes a capacitive sensor for detecting variations in the tobacco density at the tobacco end. A capacitive sensor has a flat surface containing a center electrode and an annular electrode arranged concentrically therewith, thus resembling a bulls-eye target, which generates an electric sensing field through which the tobacco ends pass.

In the apparatus of U.S. Pat. No. 3,993,194, the flat sensor surface is arranged at the end of a stationary cam, which is in the form of an angled plate. Cigarettes are moved sequentially along the cam, with their axis perpendicular to the cam, such that the tobacco ends bear against the angled surface of the cam. As the cigarettes move along the cam surface, the cam acts to adjust the position of each cigarette longitudinally so that each cigarette is at a uniform location when it reaches the sensor, and bears directly against the flat sensor surface as it moves past the sensor electrodes. As a result, each cigarette follows an identical path through the electric field created by the electrodes.

In the '194 patent, a high frequency voltage source applies the field across the electrodes. As each cigarette moves through the field, the field varies, the change in field strength being a function of the density of tobacco in the cigarette end. The variation in the electric field is measured and compared with a reference signal. If the difference falls outside a preselected range of acceptable values, thus indicating a loose tobacco end, the defective cigarette is removed. The '194 apparatus may also be used with a group of cigarettes, which are moved as a unit past the sensor, in a similar manner.

A capacitance sensor which utilizes a bulls-eye target electrode and a stationary cam positioning device, of the type described above, is currently marketed by Hauni-Werke Korber & Co. KG for use with its MAX-S tipper machinery. While this sensor is effective for high speed detection of loose ends, the sensor is extremely sensitive to various factors, one of which is variations in the position of the cigarettes as they pass through the field. Moreover, because in the course of operations many millions of cigarettes rub against the sensor, care must be taken to prevent wear of the electrode surfaces.

In order to protect the surface of the sensor, Teflon® tape is currently applied over the metal surface of the cam and sensor. Teflon tape has the advantage of being a low friction material. However, while Teflon tape effectively protects the surface of the sensor, it wears over time and needs periodically to be replaced, causing down time of the machinery. Also, the application of Teflon tape decreases the sensitivity of the device, requiring a higher potentiometer setting to be used, and thus allows more loose end cigarettes to pass undetected through the detection system which results in a quality problem.

The stationary cam, which is described above, is used to ensure precise positioning of the cigarettes, so that each moves through the field along the same path. However, as the Teflon wears, grooves are formed which affect the distance between the cigarette ends and the electrodes. Even though this distance is small, because of the sensitivity of the sensor such wear requires readjustment of the potentiometer in order to maintain the desired quality levels.

SUMMARY OF THE INVENTION

In a device of the aforementioned type, it has surprisingly been found that, by utilizing a thin glass member over the sensor surface in place of Teflon tape, not only is the wear life of the sensor substantially increased, but the capacitive sensor has improved sensitivity, when a glass is utilized, for detecting loose ends. Moreover, due both to the improved wear surface and the ability to use lower potentiometer settings, a sensor utilizing the present invention no longer requires the same daily readjustment for localized wear as in the case of a Teflon-covered sensor. As a result, not only is there less down time of the machinery, but the improved sensitivity results in greater detection accuracy.

More particularly, the present invention is a device for sensing the density of tobacco including a flat sensor surface, means for generating a capacitance field emanating from the sensor surface, means for adjusting the capacitance field, means for moving a desired portion of a tobacco article past the sensor surface in contact therewith so as to move through the electric field, and a protective member covering said sensor surface to protect the sensor surface against wear. In accordance with the invention, the protective member comprises a thin piece of flat glass adhered to the sensor surface, whereby the wear life is extended indefinitely, the sensitivity of the field is enhanced, and variations in positioning the tobacco article in the field, due to localized wear of the protective member, are virtually eliminated.

Preferably, tobacco articles are oriented generally perpendicular to the sensor surface such that the tobacco end of the articles move past the sensor surface. A stationary cam is positioned for engaging tobacco ends of tobacco articles prior to reaching the sensor surface to properly position each cigarette so that each cigarette moves past the sensor along exactly the same path. The protective glass member covers both the cam and sensor surface to provide a continuous, smooth guide surface for the tobacco ends along the cam and sensor surface.

Preferably, the glass has a thickness of about 5.5 mils, although it may have a thickness in the range of about 4 mils to 40 mils.

The sensor device preferably has a means for generating a capacitance field in the form of a center electrode and an annular electrode concentrically arranged on the sensor surface.

The glass covering has an indefinite service life when compared to that of the teflon strip, thereby virtually eliminating down time of the machinery due to transducer accuracy problems. Due to the reduced tendency to form grooves, use of the glass covering on the transducer head virtually eliminates the need to adjust the evaluating circuitry. The glass covering therefore results in improved performance and accuracy of the capacitive sensor.

For a better understanding of the invention, reference is made to the following detailed description of a preferred embodiment, taken in conjunction with the drawings accompanying the application.

DETAILED DESCRIPTION OF A PREFERRED EMBODIMENT

Figure 1:
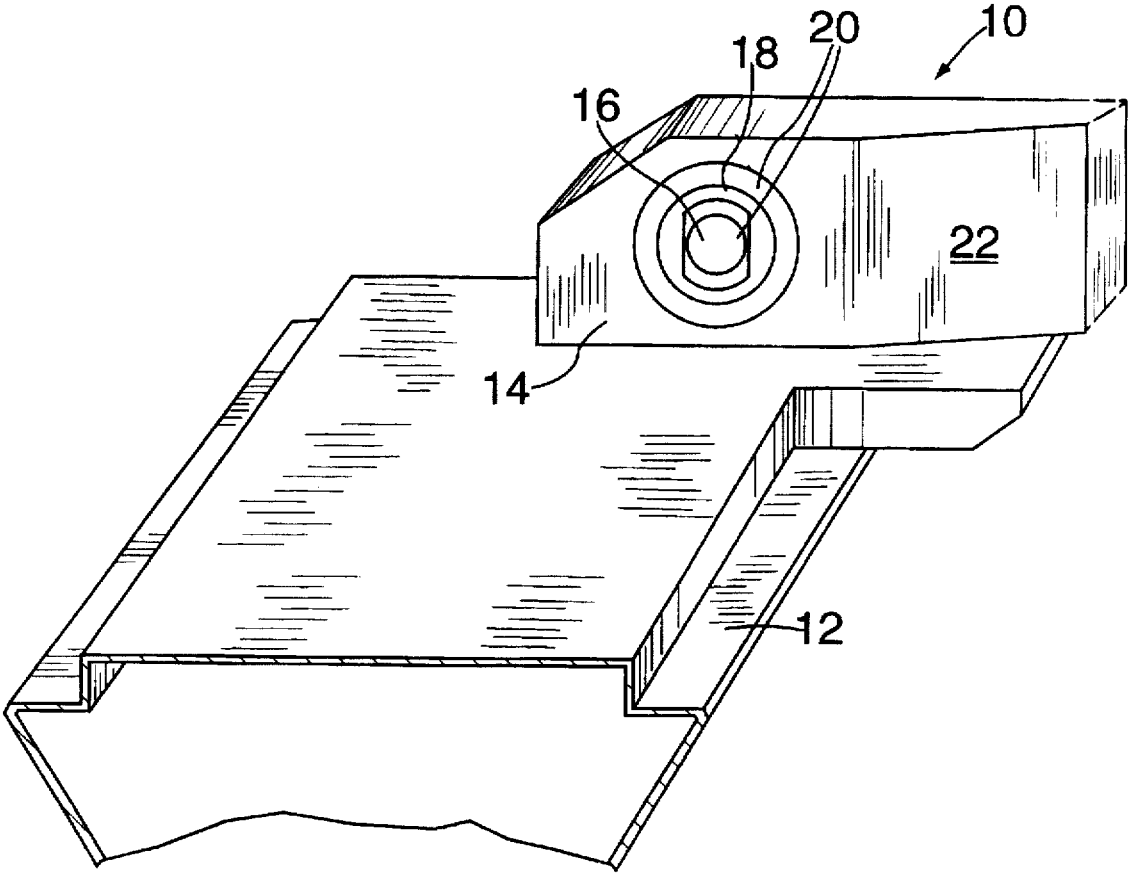
FIG. 1 is a perspective view of a sensor device and supporting housing according to the invention.
Figure 2:
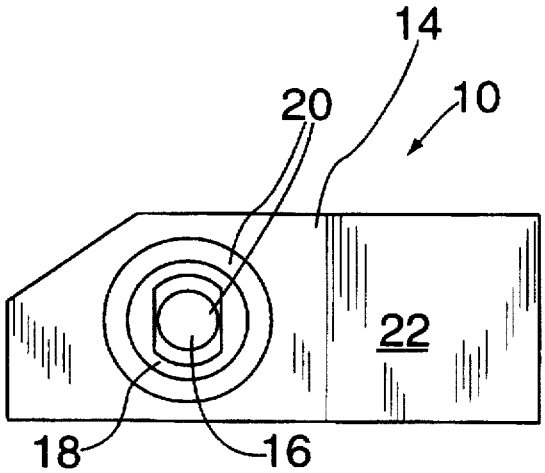
FIG. 2 is a front view of the sensor device of FIG. 1.

A device according to the invention includes a sensor device 10, which as shown in FIG. 1 is mounted on a housing 12. The assembly generally shown in FIG. 1 is suitable for installation in machinery known as MAX-S tippers. The housing 12 can be used to house some of the circuitry for the sensor device 10, which is described further in connection with FIG. 3.

The sensor device 10 includes a flat sensor surface 14, on which is provided a pair of electrodes 16, 18. Electrode 18 is annular and concentrically positioned about center electrode 16, so as to resemble a bulls-eye target. Annular insulating members 20 separate the electrodes from each other and the surrounding body of the sensor device 10.

Figure 3:
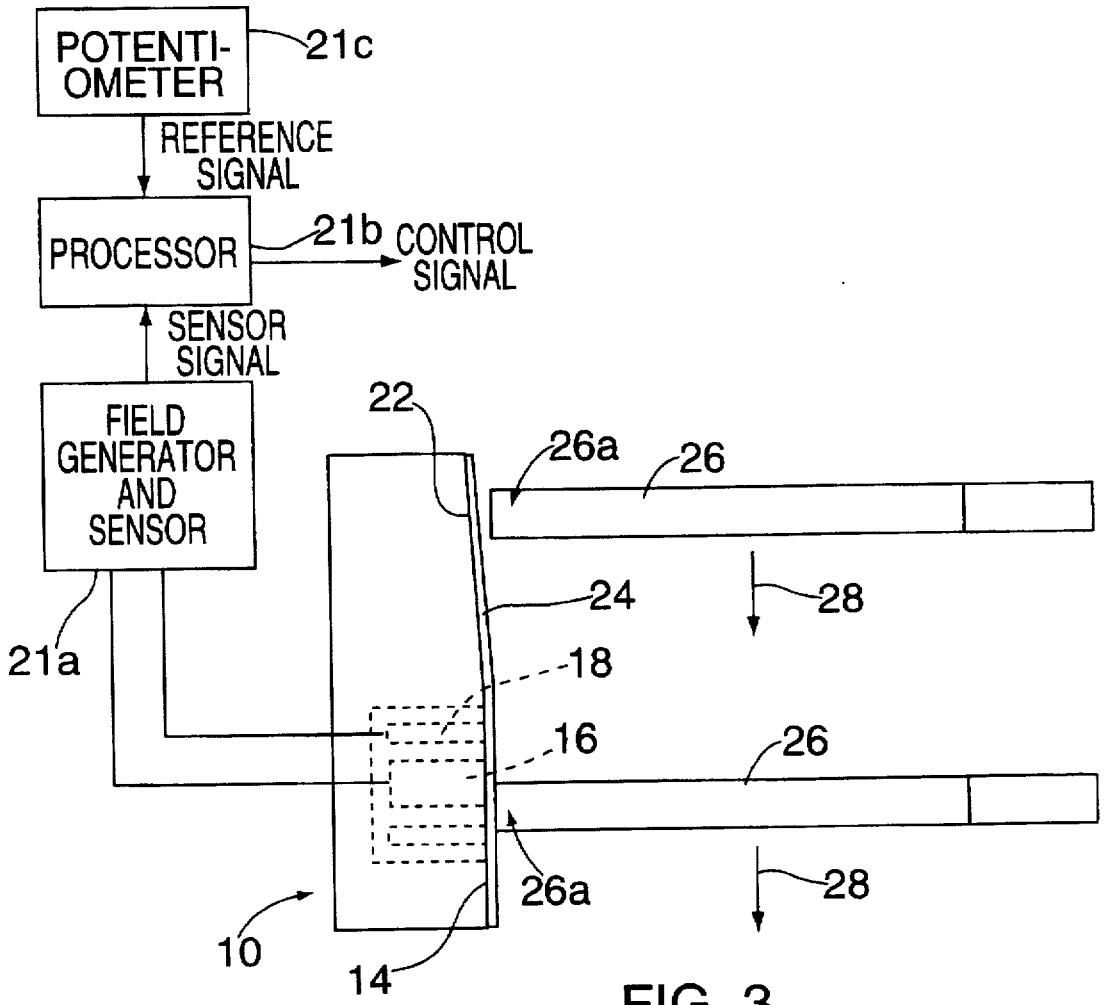
FIG. 3 is a top view of the sensor device of FIG. 1, also illustrating a schematic sensor circuit and the operation of the device.

Referring to FIG. 3, means **21*a* are provided for generating an electric field in electrodes 16, 18, and for sensing variations in the field. Processor means 21*b* are also provided. In accordance with the preferred embodiment of the invention, processor means 21*b*** are used to detect variations in field strength representative of cigarettes with loose ends, and to generate control signals for ejecting such defective cigarettes from the processing line.

Control circuitry **21*a* for generating a high frequency field in electrodes 16, 18 and for detecting variations in field strength, and processor means 21*b*** for analyzing signals to detect loose ends, are disclosed in U.S. Pat. No. 3,993,194. Such circuitry is also available commercially, such as in equipment marketed by Hauni-Werke Korber & Co. KG for use with its MAX-S tipper machinery. The control circuitry per se does not form part of the present invention, and for such reasons need not be described further here.

The sensor device 10 also includes a stationary cam 22. Cam 22 has a flat surface lying at an obtuse angle relative to sensor surface 14, so to form, in effect, a ramp. A protective member, in the form of a thin piece of glass 24, which is described further below in connection with FIGS. 3 and 4, covers the cam 22 and sensor surface 14 so as to form a smooth guide surface.

As shown in FIG. 3, tobacco articles, such as cigarettes 26, are moved along a path, indicated by arrows 28, across sensor device 10. Cigarettes may be moved by a drum, such as shown in U.S. Pat. No. 3,993,194, or by any other suitable means. As shown, the cigarettes are oriented generally perpendicular to the cam 22 and sensor surface 14, such that the tobacco ends **26*a* are adjacent the glass member 24. As each cigarette moves along cam 22, the tobacco end 26*a* engages the surface of the protective member 24 which, owing to the angled surface of the cam, pushes the cigarette axially backwards until even with the sensor surface 14. As a result, each of the cigarettes moves by the sensor in exactly the same position relative to the electrodes 16, 18**.

Figure 4:
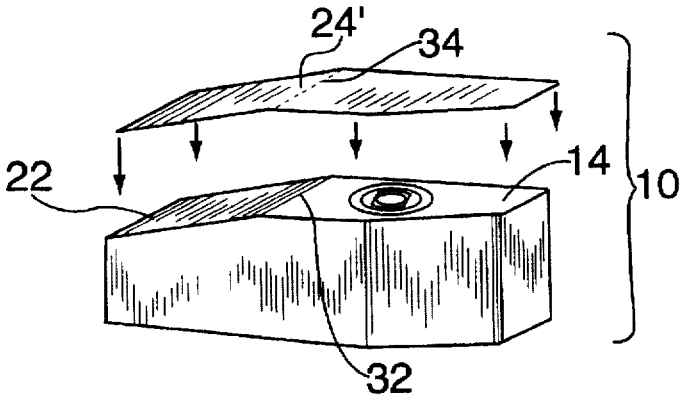
FIG. 4 is a perspective view of the sensor device illustrating a method of assembly.

Referring to FIG. 4, the process for applying the glass covering to the capacitive sensor transducer head will now be described.

Thin glass plate of a type such as borosilicate is cut generally to size, as shown at 24'. In an exemplary process, the glass is cut 1.0 mm smaller on each side than the transducer to preclude damage in normal handling and operation. The preferred thickness of the glass is 5.5 mils, although the thickness may vary within the range of 4 to 40 mils, as desired.

The cut glass covering 24' is then centered on the transducer and the apex 32 of the cam/sensor surface is marked on the glass, as shown at 34. The glass covering 24' is then placed on a carbon mold, which is bevelled to conform the glass to the bevelled face of device 10 containing the cam 22 and sensor surface 14. The glass is then formed in the carbon mold, by heating the apex, top and bottom, until a low red color is seen in the carbon. The glass then sags bringing the mold faces together to conform to the cam/sensor face of device 10.

To attach the protective glass, the shaped glass piece 24 and transducer head surfaces are first cleaned with acetone to remove any fingerprints, oil, and the like. UV curing adhesive is then applied in a strip to the center section lengthwise of the transducer head. A preferable curing adhesive is DYMAX 401 (manufactured by Dymax Engineering, a division of American & Engineering Company, 51 Greenwood Road, Torrington, Conn. 06790). The adhesive may be applied to the transducer head by using a 1 cc tuberculin syringe with a 23 gauge needle. Approximately 0.1 cc of the curing adhesive is used for a transducer head with appropriate dimensions of 26 mm×27 mm.

The formed glass 24 is then gently dropped into place, and capillary action pulls the curing adhesive uniformly across the surface, making a bubble-free seal.

The transducer head and affixed glass covering are then placed under a UV curing light source, preferably a DYMAX PC-2 light source (OSRAM Lamp ULTRAMED 400 Watt, having a wavelength A:365 nanometers, wavelength B:300 nanometers, and wavelength C:254 nanometers, which is manufactured by Dumax Engineering) for approximately ten minutes. Although curing may be effected in about 12 seconds, it is preferable to use longer cure times to effect an increase in shear strength.

Any excess adhesive that remains extending over the edges of the transducer is then cut away.

After the edges of the protective glass are polished, the transducer head with the glass covering can be mounted and used along side of the cigarette conveyor. The angled section of the glass, which overlies the cam 22, provides a guide surface for the stationary cam and thus aligns the cigarettes as they approach the flat surface, under which is the capacitive sensor 16, 18.

During operation, the tobacco end of individual cigarettes are moved along the measuring sensor which also serves as a side guide. The end of the cigarettes are scanned by capacitors in the electric field, where the field will vary as a function of the tobacco density in the end of the cigarette. Electric signals representative of the field strength are read **21*a*, and compared with a control signal from an adjustable potentiometer 21*c*, in processor 21*b***, which then generates control signals used to eject defective cigarettes.

The foregoing represents a preferred embodiment of the invention. Variations and modifications of the aforedescribed device will be apparent to persons skilled in the art, without departing from the inventive concepts disclosed herein. For example, sensor devices 10 of varying size and shape may be employed, in which case a glass protector is shaped to the appropriate size and surface configuration of the transducer (and cam) surface. All such modifications and variations are intended to be within the scope of the invention, as defined in the following claims.

We claim:

1. In a device for sensing the density of tobacco comprising a flat sensor surface, means for generating a capacitance field emanating from said sensor surface, means for adjusting said capacitance field, means for moving a desired portion of a tobacco article past said sensor surface in contact therewith so as to move through the electric field, and a protective member covering said sensor surface to protect said sensor surface against wear, the improvement wherein said protective member comprises a thin piece of glass plate adhered to said sensor surface, whereby the wear life is extended indefinitely, the sensitivity of the field is enhanced, and variations in positioning the tobacco article in the field, due to localized wear of the protective member, are virtually eliminated.

2. A device according to claim 1, further comprising means for orienting tobacco articles generally perpendicular to said sensor surface and for moving tobacco ends of the articles past said sensor surface, and a stationary cam positioned for engaging tobacco ends of tobacco articles prior to said sensor surface for locating each tobacco end at a predetermined position to contact said sensor surface, wherein said protective member comprises a piece of glass covering both said cam and sensor surface to provide a continuous, smooth guide surface for the tobacco ends along said cam and sensor surface.

3. A device according to claim 2, wherein said glass has a thickness within a range of 4 mils to 40 mils.

4. A device according to claim 3, wherein said means for generating a capacitance field comprises a first electrode and an annular electrode concentrically arranged on said sensor surface.

5. A device according to claim 2, wherein said glass has a thickness of about 5.5 mils.

6. A method for improving the performance and service life of a device for sensing the density of tobacco, the device comprising a flat sensor surface, means for generating a capacitance field emanating from the sensor surface, and means for adjusting the capacitance field, comprising the steps of: providing a thin piece of glass plate; conforming the shape of said glass plate to the sensor surface; applying an adhesive between said glass plate and the sensor surface; and adhering said glass plate to the sensor surface.

7. A method according to claim 6, wherein the steps of applying adhesive and adhering said glass plate comprise applying a UV curing adhesive between said glass plate and the sensor surface; placing the glass plate on the sensor surface; forming a bubble free seal between the glass plate and sensor surface; and placing the device and glass plate under a UV curing light source to cure the adhesive.

8. A method according to claim 6, wherein the device further includes a stationary cam, the cam and sensor surface forming a bevelled surface on the device; wherein said glass plate is provided having a thickness of between 4 and 40 mils; and further comprising the steps of cutting said glass plate to a size to cover both the sensor surface and cam; shaping said glass plate in a bevelled, heated mold conforming to the bevelled surface of the device; and then adhering the bevel-shaped glass plate onto the bevelled surface of he device.

9. A method according to claim 8, wherein the steps of applying adhesive and adhering said glass plate comprise applying a UV curing adhesive to one of said glass plate and the bevelled surface of the device; placing the glass plate on the bevelled surface; forming a bubble free seal between the glass plate and bevelled surface; and placing the device and glass plate under a UV curing light source to cure the adhesive.

* * * * *